(12) United States Patent
Pace

(10) Patent No.: US 6,388,264 B1
(45) Date of Patent: May 14, 2002

(54) OPTOCOUPLER PACKAGE BEING HERMETICALLY SEALED

(76) Inventor: Benedict G Pace, 2200 Smithtown Ave., Ronkonkoma, NY (US) 11779

( * ) Notice: Subject to any disclaimer, the term of this patent is extended or adjusted under 35 U.S.C. 154(b) by 127 days.

(21) Appl. No.: 09/633,631

(22) Filed: Aug. 7, 2000

Related U.S. Application Data

(63) Continuation-in-part of application No. 09/048,529, filed on Mar. 26, 1998, now abandoned.
(60) Provisional application No. 60/042,431, filed on Mar. 28, 1997, and provisional application No. 60/164,239, filed on Nov. 8, 1999.

(51) Int. Cl.[7] ............................................. G02B 27/00
(52) U.S. Cl. ...................................... 250/551; 250/239
(58) Field of Search ................................ 250/551, 239, 250/214.1, 214 R, 216, 208.1; 257/80–85, 431–435

(56) References Cited

U.S. PATENT DOCUMENTS

| | | |
|---|---|---|
| 4,124,860 A | 11/1978 | Johnson |
| 4,247,790 A | 1/1981 | Sahasrabudhe et al. |
| 4,672,421 A * | 6/1987 | Lin .............................. 257/80 |
| 4,776,659 A | 10/1988 | Mruk |
| 5,057,767 A | 10/1991 | Keturakis et al. |
| 5,545,893 A | 8/1996 | Brown et al. |

OTHER PUBLICATIONS

Data Sheet, Hermetically Sealed, Low $I_F$, Wide $V_{CC}$, High Gain Optocouplers, Hewlett–Packard Co., 1996. (pp. 1–12) (Month Unknown).

* cited by examiner

*Primary Examiner*—Que T. Le
(74) *Attorney, Agent, or Firm*—John F McCormack

(57) ABSTRACT

A compact, rugged, optocoupler which is a self-contained package. The optocoupler has a photon emitter mounted on the conductive pattern of a first, inorganic substrate, and a photon detector mounted on the conductive pattern of a second, inorganic, insulating substrate. The first and second substrates are bonded to an inorganic frame to form a cell containing a photon emitter opposite a photon detector. The first and second substrates and the frame also constitute the walls of the self-contained package. The optocoupler package may be manufactured with one or multiple cells in a package.

44 Claims, 15 Drawing Sheets

VIEW OF PHOTO
DETECTOR SUBSTRATE

RING FRAME

PHOTO
DETECTOR SUBSTRATE

PHOTO
EMITTER SUBSTRATE

GULLWING

LEADLESS

TOP VIEW

800
TOP VIEW

850
BOTTOM VIEW

SIDE VIEW

875
SIDE VIEW

US 6,388,264 B1

OPTOCOUPLER PACKAGE BEING HERMETICALLY SEALED

This application claims the benefit of Provisional Application No. 60/164,239 filed Nov. 8, 1999, and is a continuation-in-part of U.S. Pat. application Ser. No. 09/048,529, filed Mar. 26, 1998, abandoned, which claims the benefit of Provisional Application No. 60/042,431 filed Mar. 28, 1997.

FIELD OF THE INVENTION

This invention is related to optical isolators and optocouplers and compact ceramic packages for optocouplers.

BACKGROUND OF THE INVENTION

Optocouplers occupy an integral position in electronics by electrically isolating and separating non-common circuitry.

A common layout for optocoupler packages used on printed circuits and hybrid circuits is the side-by-side reflective construction. The light emitter and the light detector are on the same plane and covered with a transparent light piping material which is coated with a reflector to couple the light between the emitter and detector. The light piping or coupling materials are usually silicones or epoxies. Optocouplers having light piping or coupling materials are sensitive to thermal or mechanical shock, due to thermomechanical stress the light piping places on the light emitting and light detecting components and the wire bonds connected to them.

An alternate layout for optocoupler package is the over-under, direct coupling, where the light emitter is opposite the light detector. The side-by-side reflective coupler is more widely used than the over-under, direct coupled package because it has been easier to manufacture.

In plastic optocoupler packages, whether side-by-side or over-under, direct coupled optocouplers, the light emitting and light detecting devices are first mounted on lead frames and then encapsulated first in a light transparent light piping material and then an outer encapsulation of molded plastic.

Fully hermetically sealed optocoupler packages are formed by putting the light emitter and light detecting elements with the light piping in either a metal or dense ceramic package. Closure is a seal ring between the body and the cover utilizing either a low melting sealing glass or a metallic, solder or braze seal. Exclusion of moisture and other hostile gases is the object of these packages. Helium leakage rates should be less than $1 \times 10^{-8} cm^2/s$. MIL-STD-883B limits sealed-in moisture to 5,000 ppm of cavity volume. Hermetically sealed optocouplers are currently available only in standard packages sealed with a metal lid such as a T0–5 can, leaded-chip-carrier (LCC), flatpack, or duel-in-line-package (DIP). No smaller hermetically sealed packages are available.

SUMMARY OF THE INVENTION

This invention is an optical isolator comprising a photon emitter and a photon detector in the over-under direct coupling mode, i.e., opposing each other in a small, compact ceramic package. The top and bottom of the package are made from two ceramic, printed circuits which serve both as exterior walls and as functional parts of the optocoupler, making a completely self-contained package. The photon emitter and the photon detector of the optocoupler are mounted directly on the ceramic, printed circuits.

One embodiment of the invention is an optocoupler package comprising first and second inorganic, insulating substrates and an inorganic, ring frame joined to the first and second substrates forming a cell. The first substrate is a ceramic circuit having at least one photon emitter mounted on a conductive pattern of the substrate. The photon emitter is in direct over-under opposition to at least one photon detector mounted on a second, conductive pattern of a second inorganic, insulating substrate. An inorganic, ring frame surrounds the photon emitter and photon detector joining the first and second substrates together. The frame is bonded to the first and second substrates forming a hemetically sealed cell capable of containing an inert environment. The hermetically sealed cell is a completely self-contained optocoupler package.

In another embodiment the invention comprises multiple channel, photon couplers having multiple, photon emitters and photon detectors opposing each other in a small, compact package. The compact package contains multiple cells. Each cell contains at least one emitter opposing at least one detector. Each cell is optically isolated. The package is hermetically sealed, and capable of containing an inert environment. The package is capable of parallel transmission of multiple signals.

Further embodiments of the invention are simplified, low cost methods of manufacturing optocouplers wherein the package is the optocoupler.

The present invention provides a method of manufacturing hermetically sealed optocoupler packages using a minimum amount of material, labor and minimum number of manufacturing steps. In one embodiment the method comprises providing first and second, inorganic, insulating substrates, and forming conductive patterns on the substrates. A photon emitter is mounted on the conductive pattern of the first insulating substrate; and a photon detector is mounted on the conductive pattern of the second insulating substrate. The photon emitter and photon detector are surrounded by an inorganic frame, and the frame is hermetically sealed to the first and second substrates enclosing the photon emitter and photon detector spaced apart from and opposite each other. The first and second substrates and the frame form the exterior surfaces of the package.

The invention includes a method of manufacturing a hermetically sealed package containing a plurality of optocouplers comprising: printing a metallic, conductive pattern on a first, ceramic, insulating substrate; printing a metallic, conductive pattern on a second, ceramic, insulating substrate; mounting a plurality of photon emitters and photon detectors directly on the conductive patterns of the first and second substrates; hermetically sealing a ceramic frame having a plurality of cells between the first and second substrates so that a cell encloses at least one photon emitter opposite at least one photon detector.

Another embodiment of the invention is a method of manufacturing a hermetically sealed optocoupler package comprising: forming a metallic, conductive pattern on a first, planar, insulating, ceramic, substrate, the conductive pattern including conductors on the edge of the substrate; mounting a photon emitter directly on the conductive pattern of the first substrate; forming a metallic, conductive pattern on a second, planar, insulating, ceramic, substrate, the conductive pattern including conductors on the edge of the substrate; mounting a photon detector directly on the conductive pattern of the second substrate; providing a ceramic, ring frame having conductors on its outer edges; positioning the frame between the first and second substrates with the edge conductors of the frame, and first and second substrates aligned creating a cell containing a photon emitter opposite a photon detector; hermetically sealing the first and second substrates to the frame, and electrically connecting the edge conductors of the package.

Yet another embodiment of the invention is a method of manufacturing the optocoupler or optical isolator package comprising joining together three layers: the first and third layers having conductive patterns with at least one photon emitter and at least one photon detector. The second layer is a middle layer having at least one transparent window or opening surrounded by an opaque frame. The three layers are joined with emitters opposing detectors through the transparent windows of the second layer.

Objects of this invention are a hermetically sealed optocouplers having a shorter list of materials, lower packaging costs and simplified, unitary construction.

It is an object of this invention to provide an efficient method of manufacturing over-under, direct coupled, optocoupler packages.

Another object of this invention is to provide a very compact, optocoupler package.

An additional object of the invention is a robust, optical, coupler package that is resistant to thermal and mechanical shock.

Another object is an inorganic, optical, coupler package that is hermetically sealed and capable of operation at temperatures over 200° or 300° C., the operating temperature depending on the melting point of the sealing glass. These optocouplers are is thermally limited only by the temperature limitations of the light emitting and light detecting devices enclosed therein.

BRIEF DESCRIPTION OF THE DRAWINGS

FIG. 1b shows the mounting of a light emitting diode (LED); FIG. 1d shows the mounting of a photo transistor, FIG. 1c, an opaque frame to be placed between the LED and the photo transistor, and FIGS. 1e and 1f show the completed package.

DESCRIPTION OF THE INVENTION

Figure 1A:
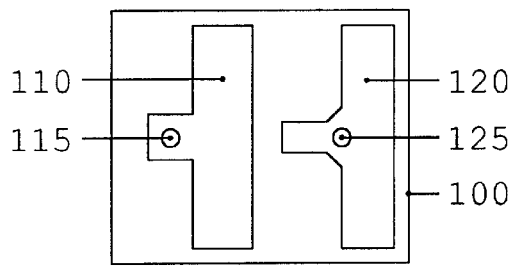
FIGS. 1a–1e illustrate the steps in preparing a single channel optical isolator or optocoupler.

The optocoupler packages of the present invention are intended to electrically isolate and optically connect two sections of an electronic or electrical device. The optocoupler may be used to transfer a signal from a low voltage circuit to a high voltage device, or from a high voltage circuit to a low voltage circuit. The multiple channel, optocoupler packages may be used wherever multiple channel, high isolation, non-ohmic signals must be transferred.

This invention is a ceramic, hermetically sealed cell comprising conductive patterns and photon emitters and photon detectors on at least two, opposing, inside surfaces of the cell walls. The hermetically sealed cell is a complete, self-contained optocoupler package.

The term conductive pattern as used herein is based on American National Standards Institute ANSI/IPC-T-51D and includes conductors, land, vias, heat sinks and passive components when these are an integral part of the printing manufacturing process.

Any photon source may be used as the source or emitter. Among suitable photon sources are those emitting infra-red, visible and ultraviolet light. Suitable light sources include, but are not limited to, light emitting diodes (LED's), laser diodes, plasma light sources, photo integrated circuits and miniature incandescent lamps. Suitable light sensors or light detectors include, but are not limited to, photo transistors, p-i-n diodes, avalanche photo diodes (APDs), photo thyristors, photo-field effect transistors (photo-FETs), photo-operational amplifiers (photo-op amps), photo resistors and photo integrated circuits.

Each cell or transmission channel of the optocoupler will have at least one light emitter opposing at least one light detector. In some embodiments a cell may have one light emitter facing two or more light detectors so that two or more circuits may be controlled with one optical signal. Conversely, a cell may have two or more light emitters facing a single detector, so that either emitter may control the detector circuit. A single cell may have a combination of at least one light emitter and one light detector opposing at least one light emitter and/or light detector for bi-directional optical transmission or self test.

In a preferred method of manufacturing optocouplers according to this invention, the optocoupler is made up of three layers or lamina which are joined together. The first and third layers comprise conductive patterns on inorganic insulating substrates. The first layer is a ceramic substrate that has the light emitter (e.g. an LED) mounted on it forming a ceramic circuit. This first circuit layer has the electrical connections to the light emitter and may contain related components. The second or middle layer makes an opaque frame or wall surrounding the light emitter. The frame may be a single layer or be constructed of two or more laminae joined together. The frame is attached to the substrate of the first layer and the substrate of the third layer. To allow passage of the emitted light, the portion of the second layer over the light emitter is open or it may contain a transparent insulation material. The third layer is a ceramic substrate having the light detector (e.g. a photo transistor) mounted on it forming a second ceramic circuit. It has the electrical connections to the light detector and may contain related components. The three layers are joined together with the light emitter opposing the light detector in a compact package wherein one ceramic circuit forms the base of the package and the other ceramic circuit forms the lid.

The multiple channel optocouplers are manufactured using techniques similar to those used for single channel couplers. The first layer has the light emitters, associated circuitry, if any, and electrical connections for each channel. The second or middle layer is an openwork or lattice layer with opaque walls surrounding and separating each channel. The openwork or lattice structure is a common frame serves as a ring frame around each cell. The third layer has the light detectors, associated circuitry, if any, and the required electrical connections. The three layers are joined together to make a compact, multi-channel optocoupler.

A preferred method of manufacturing the optocouplers is by hybrid circuit processing using thick film, thin film or co-fired circuit techniques. The hybrid circuit, conductive patterns may include passive components such as thick film or thin film resistors. Other passive components and discrete, active or passive components may be included in the hybrid circuit. The electrical connections for the first and third layers are produced and the light emitting and light detecting components attached using standard hybrid circuit techniques. The three layers are joined together to make a rugged, hermetically sealed, compact package.

The size of a compact optocoupler package manufactured by the methods and procedures described herein depends on the size of the larger of the photon emitter and the photon detector. In the smaller packages the photon emitter and detector may be tightly fitted into the package, and the length and breadth dimensions inside the enclosure surrounding the photon emitter and the photon detector need be greater than the emitter and detector in only one dimension to allow room for the associated wire bonds, e.g. about 10 mils (250 $\mu$m) greater. A typical photon detector, with a length and breadth of 50 mils (1.27 mm), with associated wire bonds requires a internal cavity of 70 mils by 50 mils (1.78 mm×1.27 mm), and a package with an outside length and breadth of only 90 mils by 70 mils (2.29 mm×1.78 mm). The inside height dimension needs to be greater than the combined thickness of the emitter and detector. This allows a minimum space between the emitter and detector and their wire bonds. Of course the dimensions of the optocoupler may be considerably larger, especially when higher voltage breakdown is required.

Outside dimensions for a package of a single cell optocoupler can be 1.5 mm (60 mils) wide, 2 mm (80 mils) long and 1.5 mm (60 mils) high. When more optocoupler cells are included for a multiple channel, optocoupler package, the size of the package increases in proportion to the number of cells.

The contacts on the exterior walls of the optocoupler packages are connected by the respective conductive patterns to the photon emitter and photon receptor and the contacts may include leads such as J-leads, flat pack leads, pins and the like.

Figure 1D:
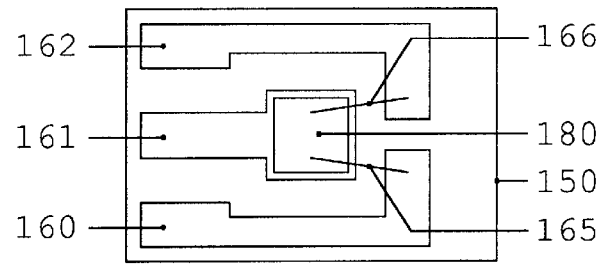
Figure 1B:
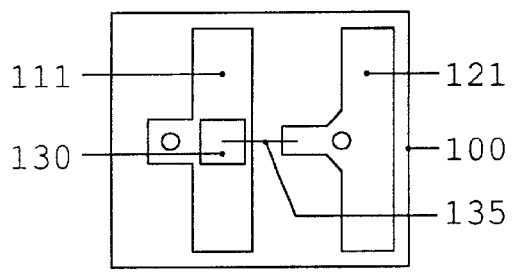

A single cell optocoupler of this invention was manufactured as shown in FIGS. 1a–1f and described below. The first layer of the optocoupler was a planar, alumina substrate 2.2 mm×2.5 mm and 0.25 mm thick (85 mils×100 mils×10 mils). The alumina substrate was provided with a thick film, conductive pattern printed on both sides of the alumina substrate. FIG. 1a shows one side of the first layer alumina substrate 100 with thick film conductors 110 and 120, and hermetic via connections 115 and 125 to the other side of the substrate. A large number of tiny substrates were simultaneously processed on a sheet of alumina 50 mm×50 mm (2 in.×2 in.). FIG. 1b shows the other surface of the alumina substrate with an conductive pattern layer with conductors 111 and 121 and a light emitting diode (LED) 130 (Type OPC226™ from Optek Technology, Inc., Carrollton, Tex. 75006, USA) mounted on the conductor 111 and with a wire bond 135 to conductor 121.

Figure 1E:
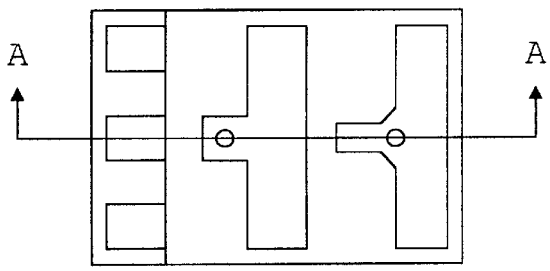
Figure 1C:
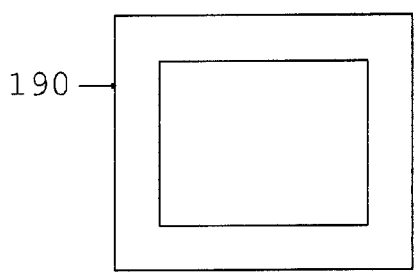

The second or middle layer was an opaque, alumina frame 190 as shown in FIG. 1c. The outside length and breadth of the frame were 2.2 mm×2.5 mm (85 mils×100 mils); the same as those of the first, alumina substrate 100. The frame was 1.5 mm (60 mils) high, and the wall thickness was approximately 0.4 mm (15 mils).

FIG. 1d shows the third, alumina substrate layer 150 which was 2.2 mm×3 mm and 0.25 mm thick (85 mils×120 mils×10 mils). This substrate was the third layer for the optocoupler. It had a thick film, conductive pattern with conductors 160, 161 and 162 and photo transistor 180 (Type OPC200™ from Optek Technology, Inc., Carrollton, Tex. 75006, USA) mounted on the collector conductor 161 with wire bonds 165 and 166 to the base and emitter conductors 160 and 161.

Figure 1F:
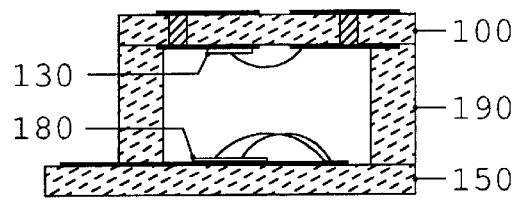

FIG. 1e is a top view of the completed optocoupler package looking down on the first layer. FIG. 1f shows a cross section of the package of FIG. 1e along line A—A. The first layer, alumina substrate 100 bearing the LED 130, is positioned opposite the third layer, substrate 150 with the photo transistor 180, and the two substrates are separated by second or middle layer, or frame 190. All three layers were joined together as shown in FIG. 1f. The outside dimensions of this compact optocoupler package were 2.2 mm×3.0 mm×2 mm (0.085 in.×0.12 in. ×0.08 in.).

The insulation value of dry air is 3000 V/mm (75 V/mil). The height of the frame 190 was selected to provide sufficient air gap for 2500 V breakdown voltage between the wire bond 135 of the LED and the wire bonds 165 and 166 of the photo transistor. The isolation voltage of the optocoupler was tested and found to be over 2000 V, off the scale of the test instrument.

The optocoupler package was resistant to thermal and mechanical stress. Even after being dropped to a concrete floor and stepped on, the optocoupler package sustained no damage and was fully functional.

FIG. 2 shows a very compact, optocoupler package where the first and third layers are both alumina substrates 2.2 mm×2.5 mm (85 mils×100 mils). One side of each substrate 200 is provided with thick film, pad pattern 210 as is shown in FIG. 2a. The other side of each substrate is printed with the thick film, conductor pattern 260 which is connected to the pad pattern 210 by vias 215, shown in FIGS. 2b and 2c. In FIG. 2b, the first layer, alumina substrate, also shows the LED 230 mounted on one conductor with wire bond 235 to the other conductor. Likewise FIG. 2c shows the third layer alumina substrate with a photo transistor 280 with the collector bonded to one conductor and emitter wire bonded to the other conductor.

The second or middle layer is an opaque, alumina frame with the same dimensions as the frame 190 shown in FIG. 1c, 2.2 mm×2.5 mm and 1.5 mm high (85 mils×100 mils×60 mils). The three layers are joined together with the LED opposing the photo transistor to provide a package only 2.5 mm long, 2.2 mm wide and 2 mm high (100 mils×85 mils×80 mils) which exhibits greater than 1500 V breakdown, and has connections on standard 1.3 mm (50 mil) centers.

Figure 2A:
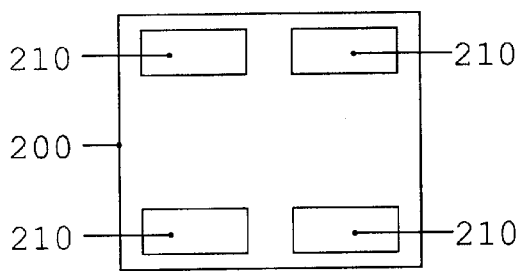
FIGS. 2a–2j illustrate the steps in preparing other single channel optical isolators or optocoupler packages.
Figure 2D:
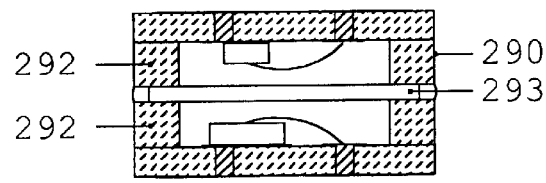
Figure 2B:
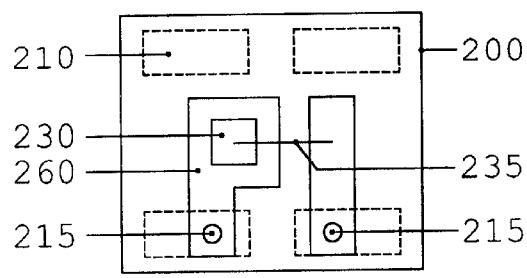

FIG. 2d shows a cross section of an embodiment of the invention where the second or middle layer 290 is composed of two opaque, alumina frames 292 2.2 mm×2.5 mm (85 mils ×100 mils) but only 0.3 mm (12.5 mils) high with a layer of transparent glass 293 130 $\mu$m (5 mils) sandwiched between them. The breakdown voltage of the glass is 25 V/$\mu$m (600 V/mil). The substitution of a glass window for the air gap permits a reduction of the height of the second or middle layer 290 to 0.76 mm (30 mils), so that the overall height of the optocoupler is reduced from 2 mm (80 mils) to 1.3 mm (50 mils) while significantly increasing the voltage breakdown.

Figure 2E:
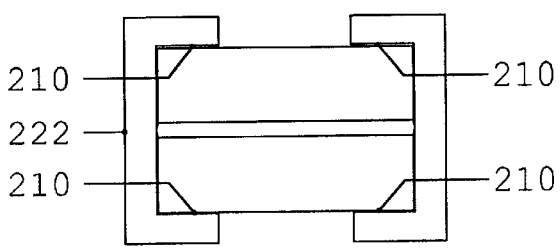
Figure 2C:
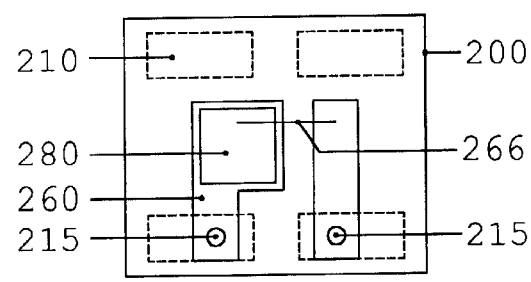
Figure 2F:
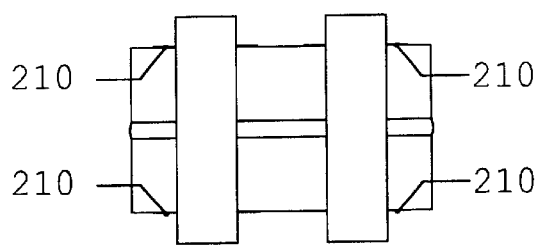

FIGS. 2e and 2f are side views of the optocoupler package with claw leads 222 (available from NAS Electronics, Flushing, N.Y. 11354, USA) affixed to the pads 210 for a surface mounting of the optocoupler package.

Figure 2G:
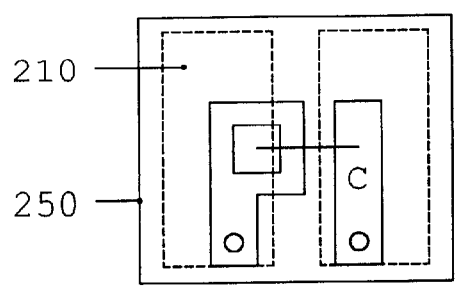
Figure 2I:
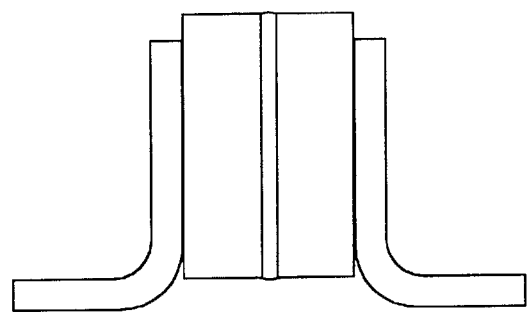
Figure 2H:
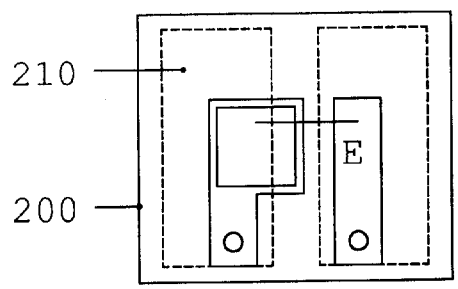
Figure 2J:
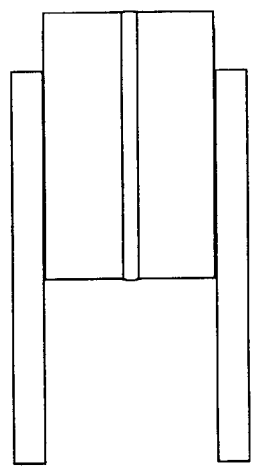
Figure 3A:
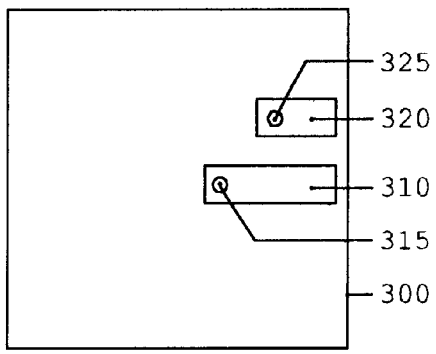
FIGS. 3a–3g show the steps of preparing an optocoupler package with a single light source and a plurality of light sensors.
Figure 3B:
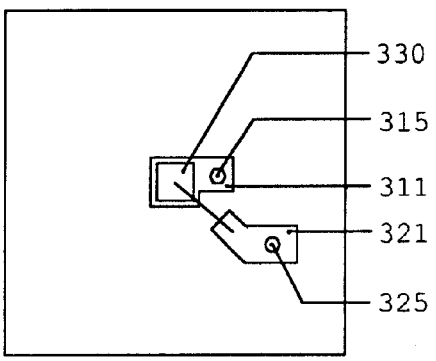
Figure 3C:
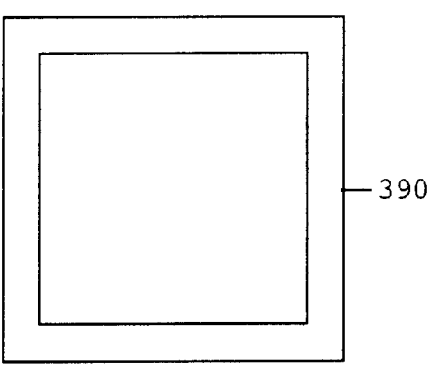
Figure 3D:
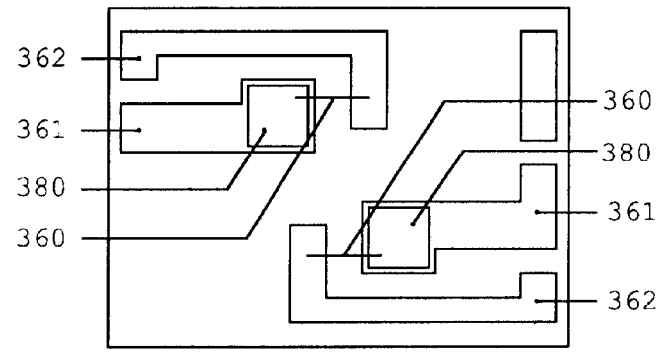
Figure 3E:
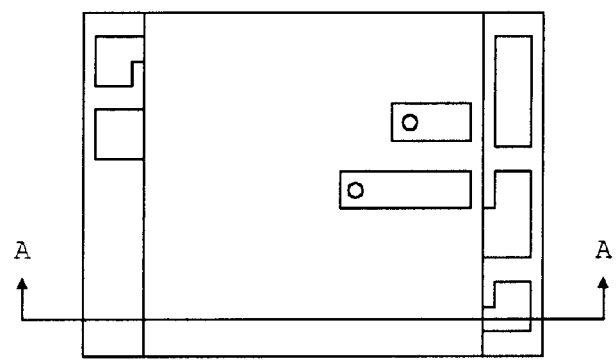
Figure 3F:
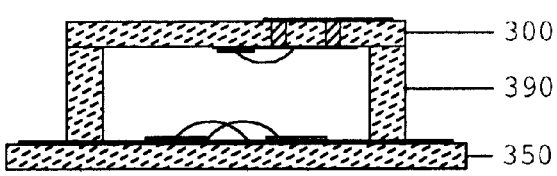
Figure 3G:
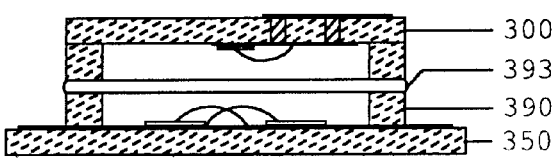

FIGS. 2g and 2h show a conductive pattern with only two pads 210 on the reverse side of the first layer 200 and third layer 250. The optocoupler package is provided with a second layer having a glass window as described above. FIG. 2i shows the optocoupler with flat pack leads brazed or soldered to the pads 210, and FIG. 2j shows a version of the optocoupler package with pin leads attached to the pads 210.

FIG. 3 illustrates an optocoupler with one light source driving two light sensors. In FIG. 3a, a first layer substrate 300 is provided with surface pads 310 and 320 connected to vias 315 and 325. In FIG. 3b on the other side of the first layer substrate 300 are conductors 311 and 321 connected to vias 315 and 325 respectively. The light source, an LED, 330 is mounted on conductor 311 and connected by a wire bond 335 to conductor 321. The second or middle layer 390 is shown in FIG. 3c. The third layer substrate 350 in FIG. 3d has two photo transistors 380 with the collectors mounted on two separate conductors 361 and connected by wire bonds 365 to conductors 362. FIG. 3e is a top view of the optocoupler, and FIG. 3f is a cross section view along line A—A of FIG. 3e. FIG. 3g is a cross section view of an optocoupler where the second or middle layer 390 contains a transparent, solid insulator 393 for higher isolation voltage.

An implementation of an 8-channel, optocoupler package is shown in FIG. 4. The first and third layers were prepared as double-sided, thick film, conductive patterns on alumina substrates 13.2 mm long, 7.37 mm wide and 0.38 mm thick (0.52 in.×0.29 in.×0.015 in.). The front side, conductive pattern is shown in FIG. 4a and FIG. 4b, and the back side 420 is shown in FIG. 4c. The front and back conductive patterns were connected by conductive vias 415.

Figure 4A:
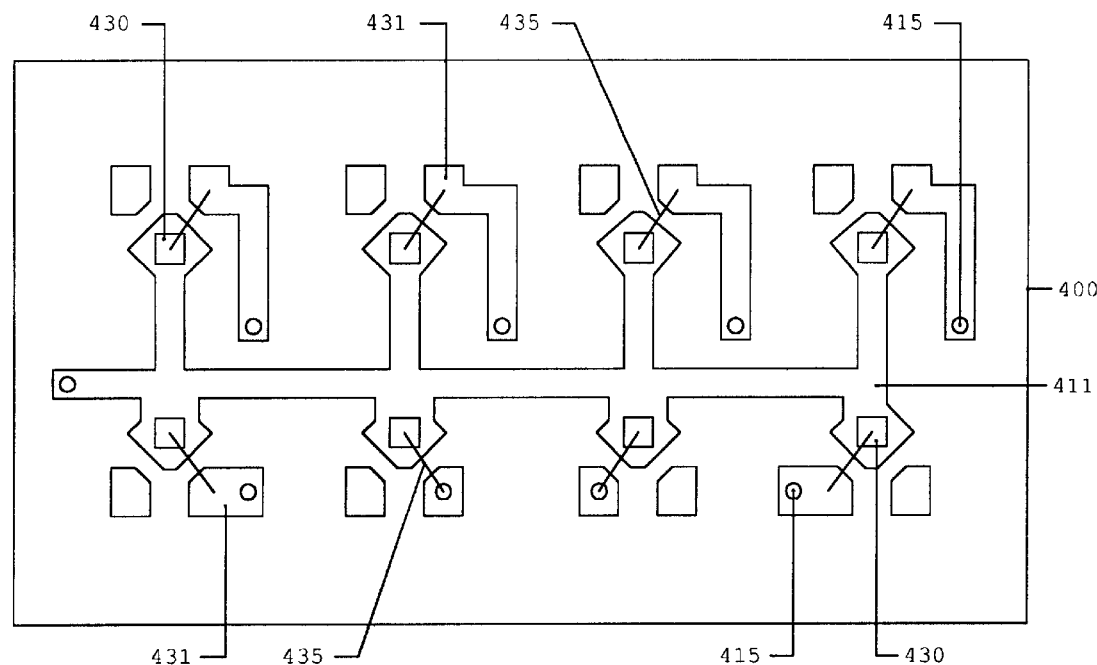
FIGS. 4a–4l illustrate the steps in preparing an 8-channel optical isolator or optocoupler package.

LED's 430 were mounted on one substrate 400 and wire bonded 435, as is shown in FIG. 4a. The anodes of all the LED's were connected together by the conductor 411. The LED cathodes were connected by wire bonds to conductors 431 and bought out individually through the vias 415 to the pads on the other side of the substrate.

Figure 4B:
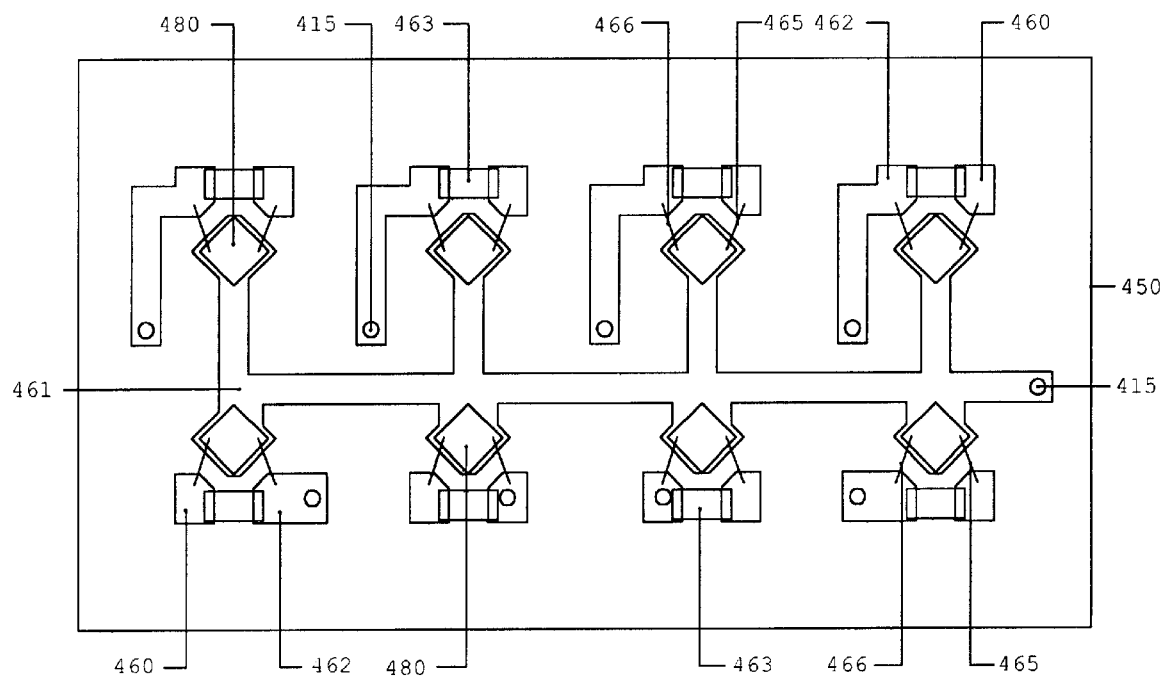
Figure 4C:
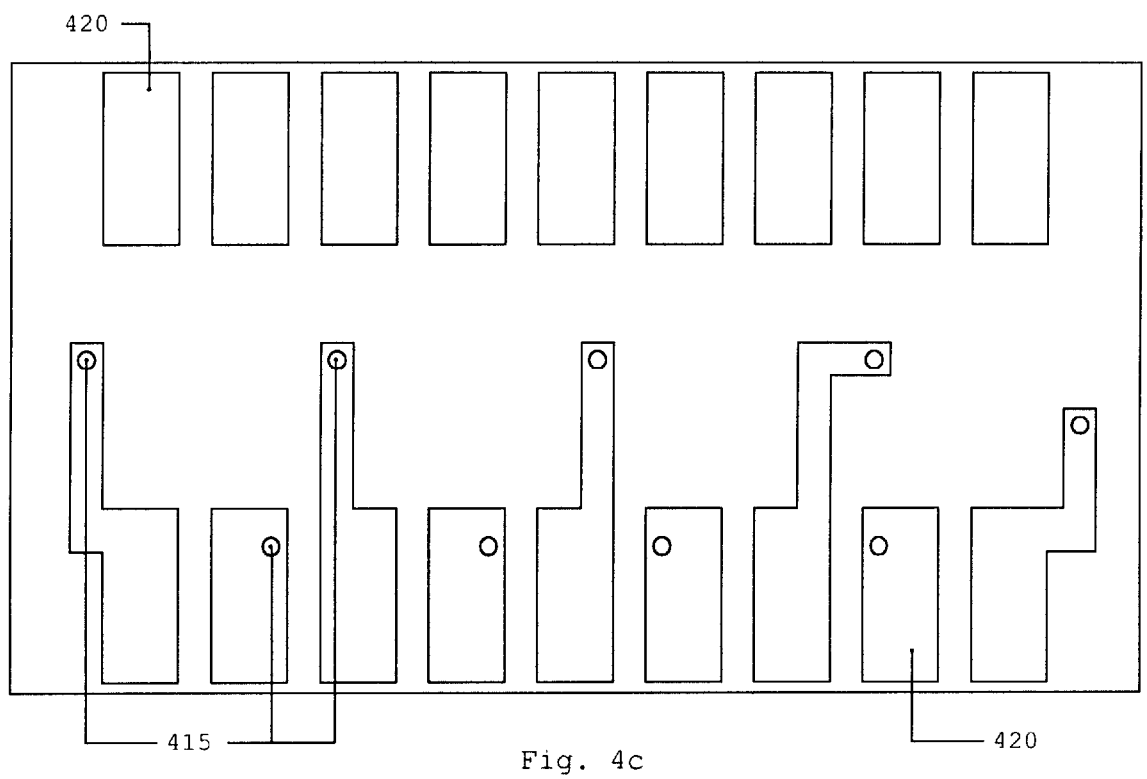

The photo transistors 480 were mounted on the other substrate 450 shown in FIG. 4b. The collectors of all the photo transistors are connected together by conductor 461. The base and emitter of each photo transistor were connected by wire bonds 465 and 466 to conductors 460 and 462 and bought out to pads on the other side of the substrate through vias 415. Before the photo transistors were mounted, the base and emitter conductors were joined through 150 k ohm printed resistors to increase the switching speed and noise immunity.

Figure 4D:
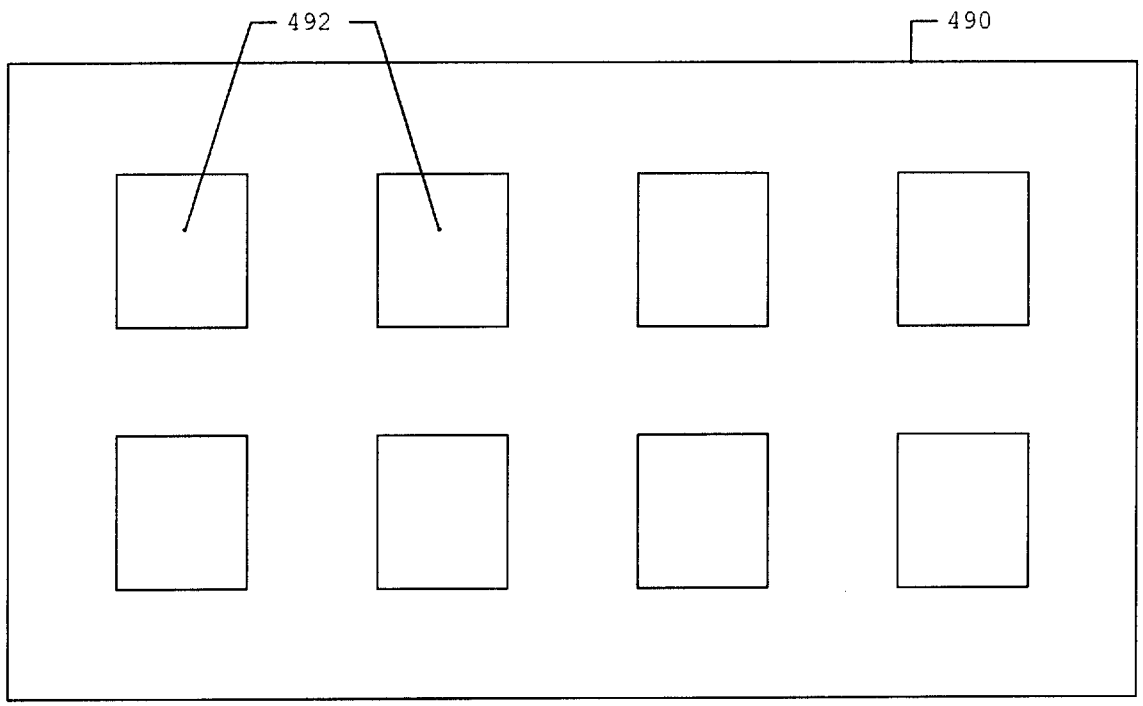

The second or middle layer, as shown in FIG. 4d, was composed of two opaque 92% alumina laminae 490, each 13.2 mm long, 7.37 mm wide and 0.64 mm thick (0.52 in.×0.29 in. ×0.025 in.) with multiple openings or windows 492 for the LED's and photo transistors and their wire bonds. One opaque, alumina lamina with the multiple openings was joined to the substrate 400 having the LED's and the other opaque, alumina lamina was joined to the substrate 450 on which the photo transistors are mounted. The opaque laminae were joined to the substrates with an epoxy adhesive. If a hermetic package is required, a hermetic bond such as a sealing glass is used for joining.

Figure 4E:
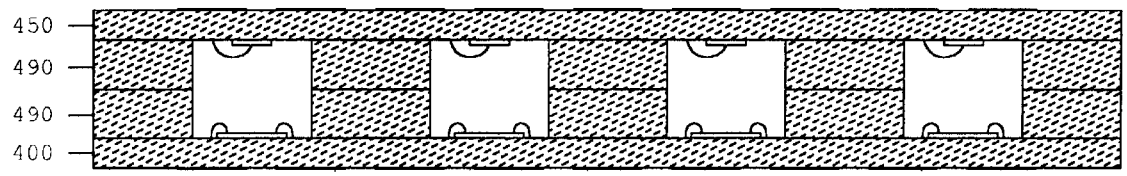
Figure 4F:
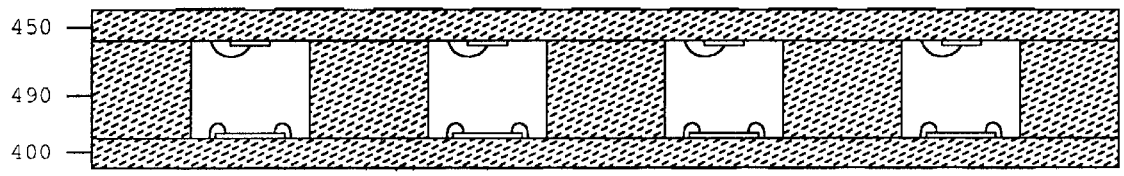

As shown in FIG. 4e the two substrates were bonded together with each LED facing a photo transistor. The combined height of the opaque alumina laminae 490 is sufficient to provide effective isolation between the opposing substrates. In an alternative construction, shown in FIG. 4f, the second or middle layer is one alumina lamina 1.27 mm (50 mils) thick.

Figure 4L:
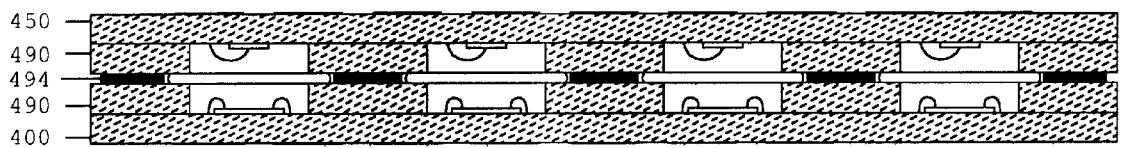
Figure 4G:
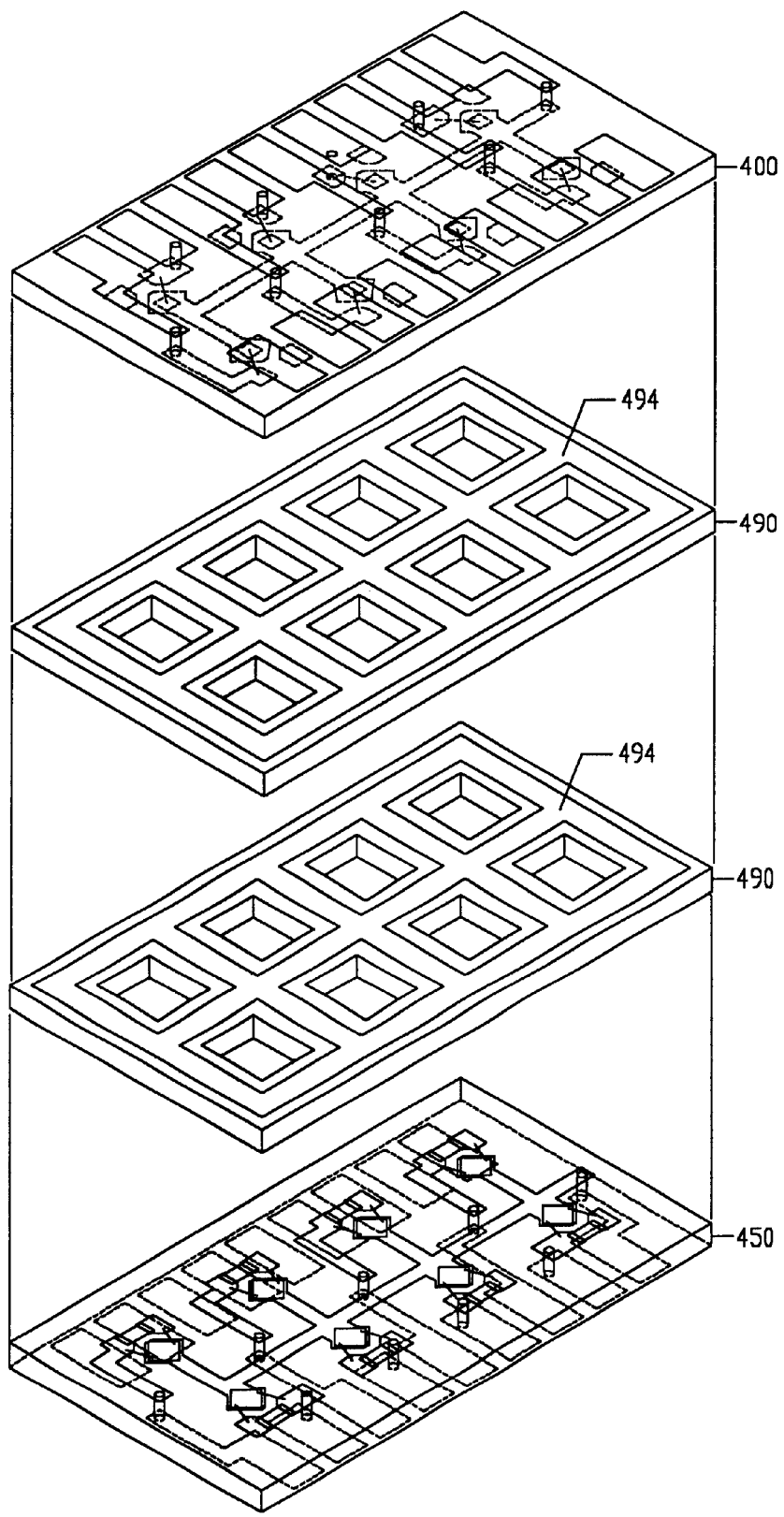

FIG. 4g shows an exploded isometric view of the 8 channel optocoupler package with a bonding agent 494 on the opaque alumina sheets 490.

Figure 4H:
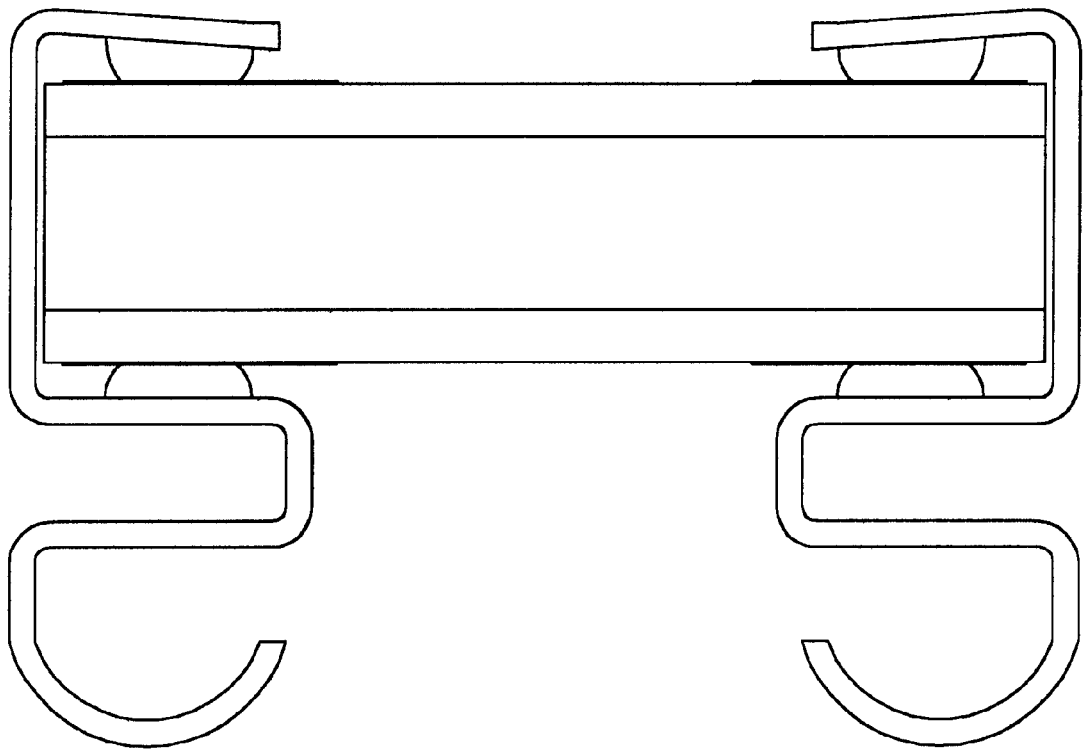

The conductive pattern of the alumina substrates brings all the photo transistor emitters and collector signals to one side of the channel optocoupler package and all the LED signals to the other side. FIG. 4h is an end view of the optocoupler package after the outside pads on the top and bottom of the package were joined together by claw leads (commercially available as "J" Claw Leads from NAS Electronics 120–12 28th Ave., Flushing, N.Y. 11354, USA). The claw leads are soldered to the outside pads of the package providing nine LED leads (one common anode and eight cathode leads) on 50 mil centers on one edge of the package, and nine photo transistor leads (one common emitter and eight collector leads) on 50 mil centers on the other edge of the package.

Figure 4I:
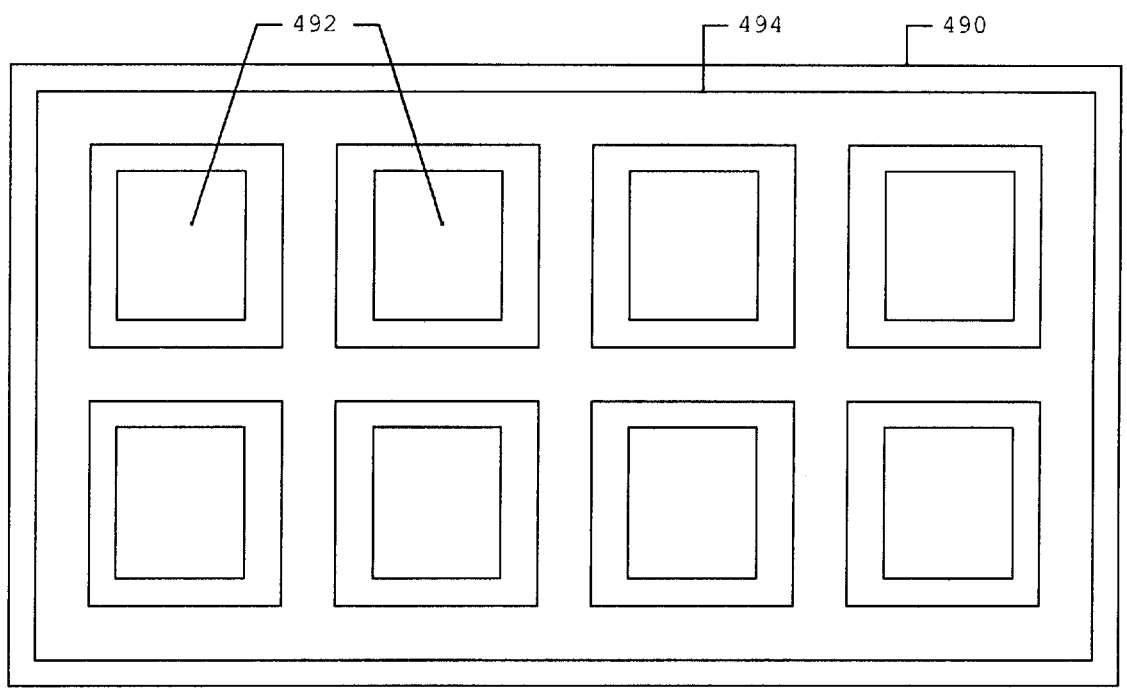
Figure 4J:
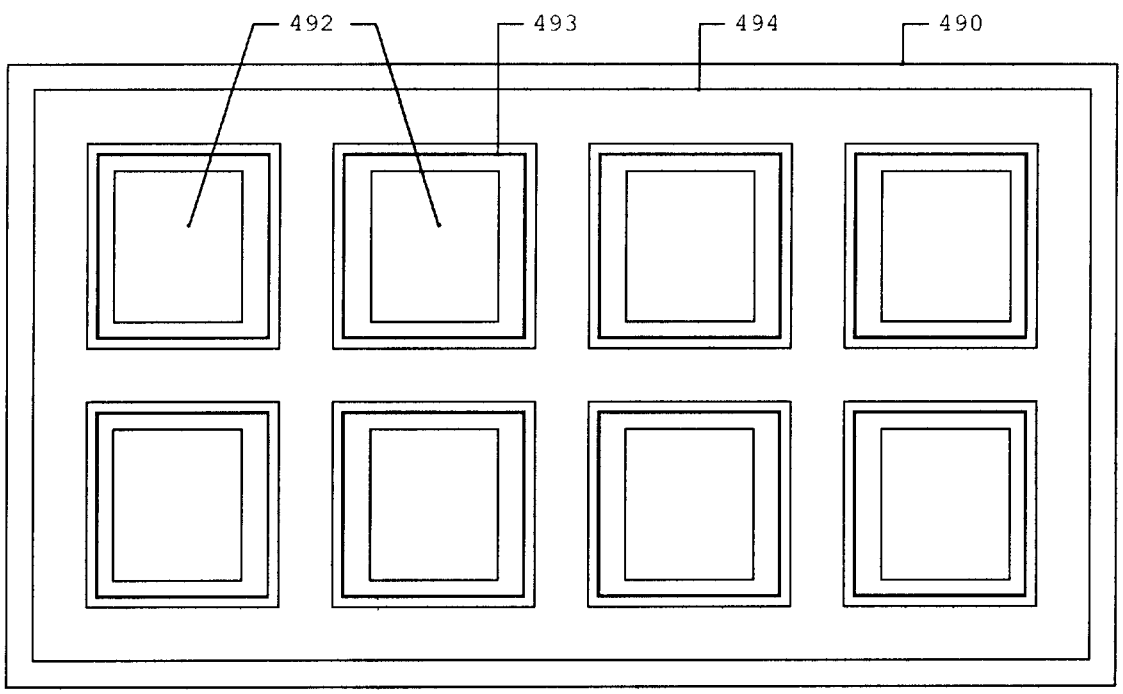
Figure 4K:
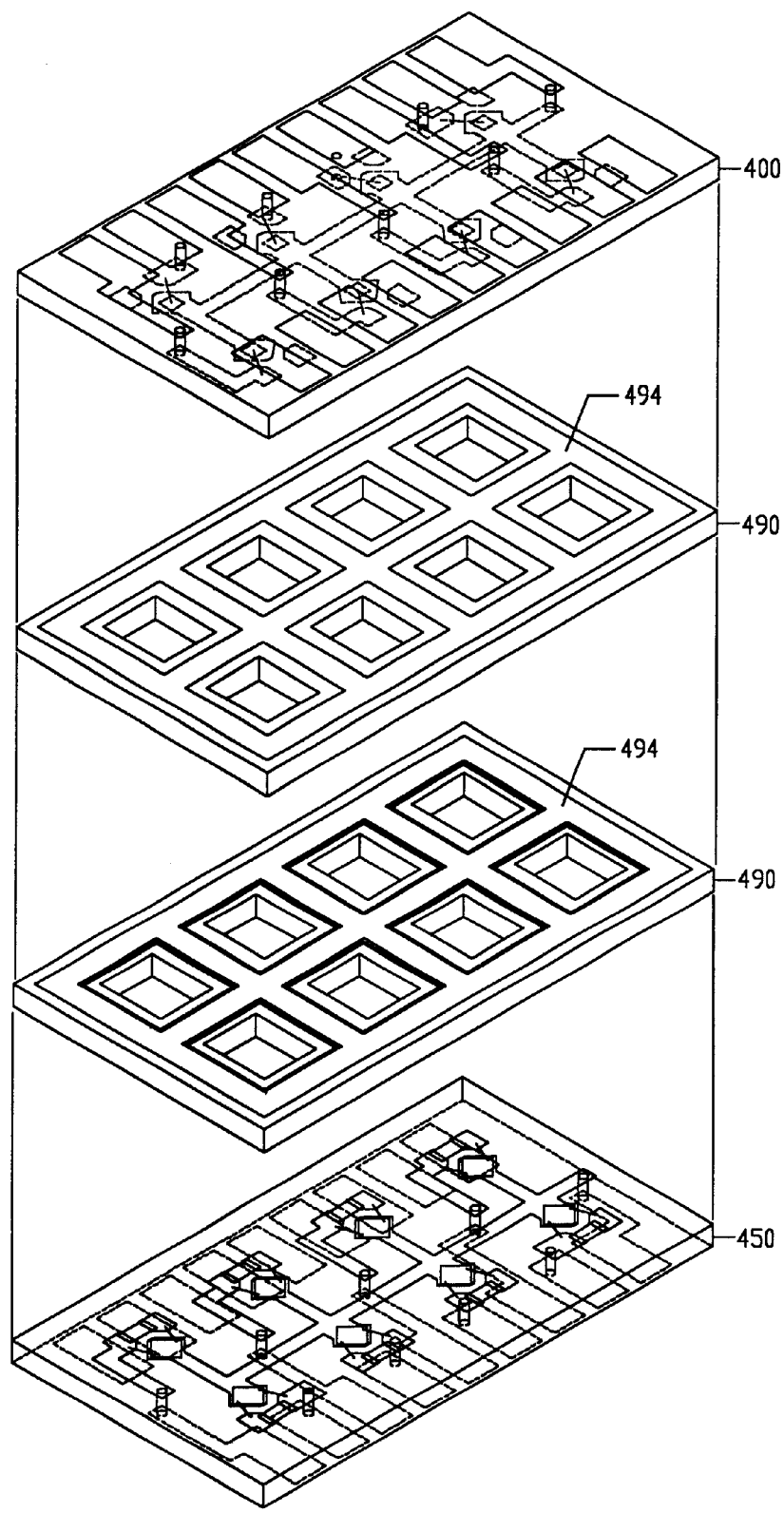

In order to provide a package with even greater electrical isolation, the second or middle layer 490 is provided with a glass window 13 μm (5 mils) thick. An opaque, sealing glass 494 is printed around the windows 492 as shown in FIG. 4i. The glass windows 493 are put in the small depressions created by the sealing glass as shown in FIG. 4j. FIG. 4k is an exploded isometric view of the higher isolation, 8-channel, optocoupler package incorporating the glass windows. FIG. 4l is a cross section of the optocoupler with the opaque sealing glass 494 between the edges of the glass windows.

Other discrete components can be added to the package. An integrated circuit to buffer the input to the LEDs easily can be accommodated by adding a ninth cell containing the integrated circuit to the eight cells shown in FIG. 4.

For mass production of single or multi-channel optocouplers, a preferred manufacturing method starts with green (unfired) ceramics. The first layer is a green ceramic composition having a conductive pattern printed with a refractory metal paste. In order to provide connections to the optical devices the conductive pattern of refractory metal can be bought to the edge of the first layer for subsequent attachment of connecting leads, or it may be bought to the reverse side of the first layer by conductive vias. The second layer, which forms the ring frames, may be composed of two, green ceramic preforms, one of which is cofired with the first layer and the other with the third layer. The second layer, green ceramic preform has openings for the transmission of optical signals from the first to the third layer.

In an alternative procedure the second layer, or ring frames, may be one green ceramic preform which is cofired with a green ceramic for the first layer. The third layer is a planar, ceramic circuit, and us joined to the second layer with sealing glass after the light emitters and light detectors are in place.

Figure 5A:
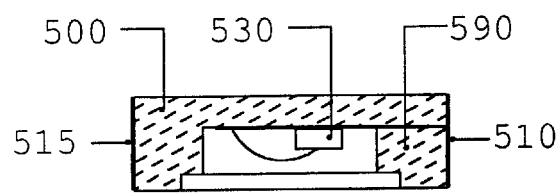
FIGS. 5a–5d illustrates preparation of an optocoupler using cofired ceramic circuit techniques.

This process is illustrated by the following procedure for a single channel coupler. Referring to FIG. 5a, one half of the second layer 590 is joined to the first layer 500; they are cofired together; after firing, the light source 530 is connected to the conductive pattern of the first layer. In FIG. 5a the cofired edge conductors 510 are connected to the light source, and cofired edge conductors 515 are connected to the light detector on the third layer.

The third layer in also a green ceramic with refractory metal conductive pattern. A green ceramic preform comprising half of the second layer is joined to the third layer. An optional transparent insulator may be included. If glass is used as the insulator, this green preform may include a recess around the opening for the insulating glass. The green, third layer and the preform are cofired together. Referring to FIG. 5b, after firing the third layer, a light sensor 580 is connected to its conductive pattern and a glass window 593 is fitted to a recess 595 in the second layer. In FIG. 5b the cofired edge conductors 510 will be connected to the light source, and cofired edge conductors 515 are connected to the light detector on the third layer.

Figure 5C:
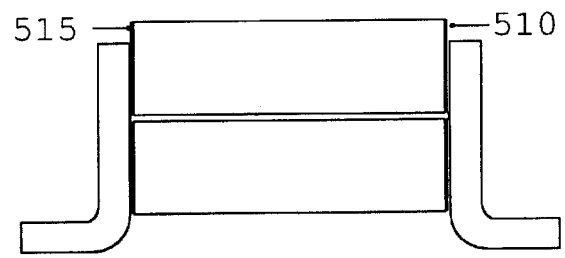
Figure 5B:
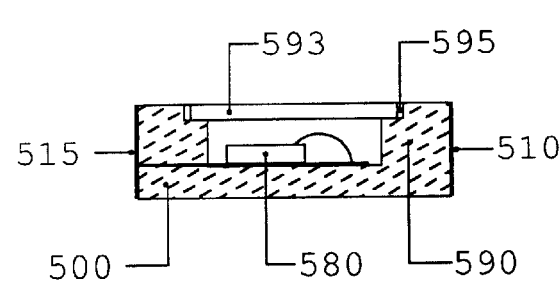
Figure 5D:
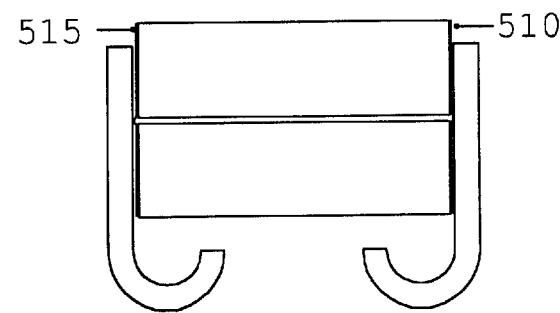

FIG. 5c is an end view of the optocoupler package with the third layer joined to the second layer so that the light emitters and light detectors of the first and third layer oppose each other. The package is equipped with flat pack leads attached to edge conductors 510 and 515. FIG. 5d shows a package with "J" leads brazed or soldered to the edge conductors 510 and 515.

In addition to a dry atmosphere and glass, the windows in the opaque frames can contain any other material which is transparent to the light emitted and has a high voltage breakdown. For special applications the window may contain a lens to transmit the emitted light. Although square and rectangular window openings are illustrated in the drawings, any geometric shape including, but not limited to, circles, ellipses, hexagons and the like can be used.

A 4-channel optical isolator transceiver can be manufactured in the same type package as the 8-channel optocoupler by putting four LED's and four photo transistors on the first layer and four photo transistors and four LED's on the third layer opposing them through the openwork lattice of the second layer. This provides four optical channels in each direction in the same package as the eight channel optocoupler.

A multi-channel, optical transceiver can be manufactured by putting both a light source and light detector on each side of every cell, which allows bi-directional transmission of data through each cell.

Figure 6:
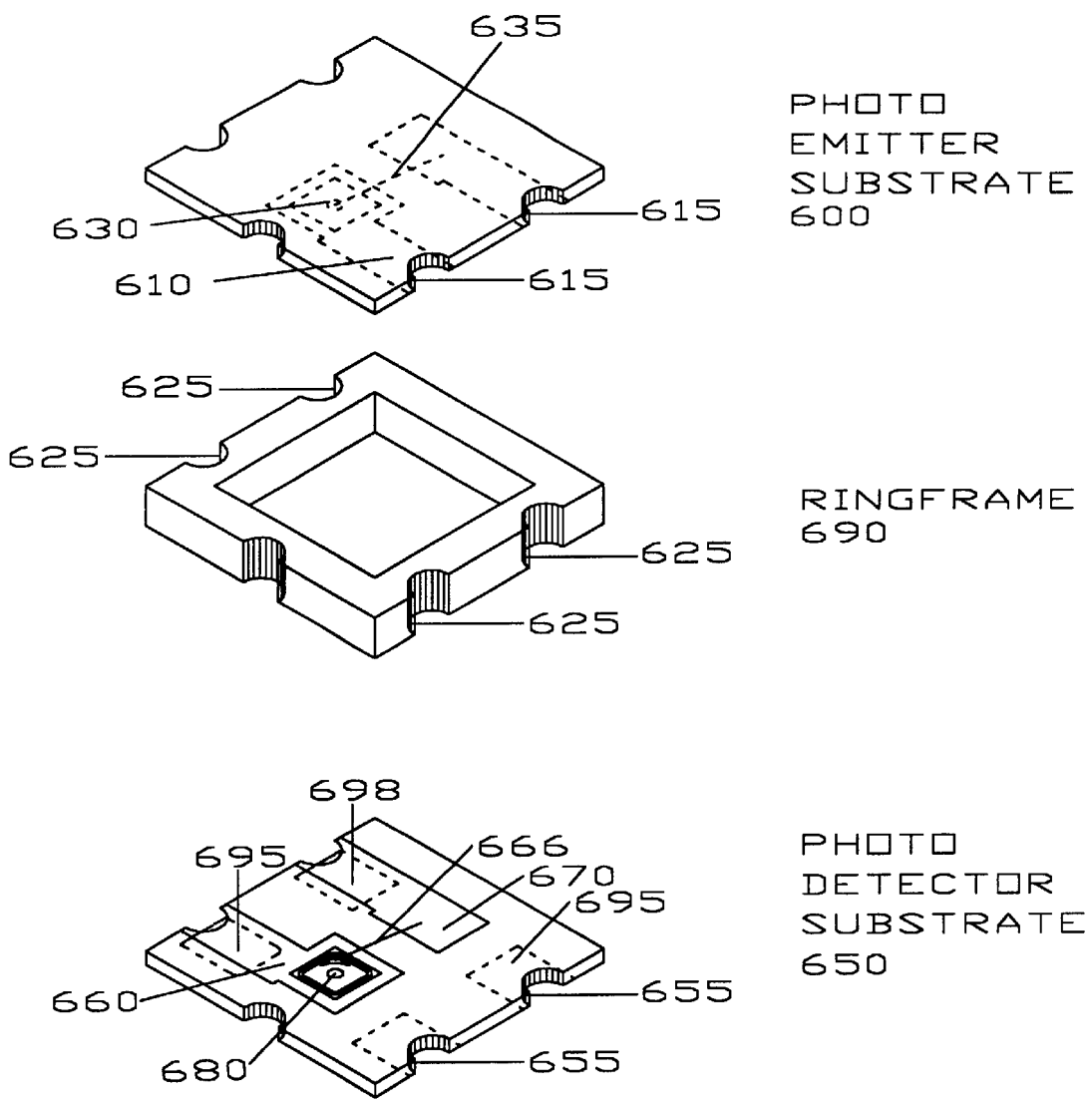
FIG. 6 is an exploded view of a miniature optocoupler package.
Figure 7A:
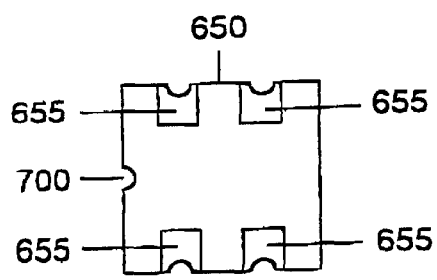
FIGS. 7a–7d shows the conductive pattern layers of the miniature optocoupler package.
Figure 7B:
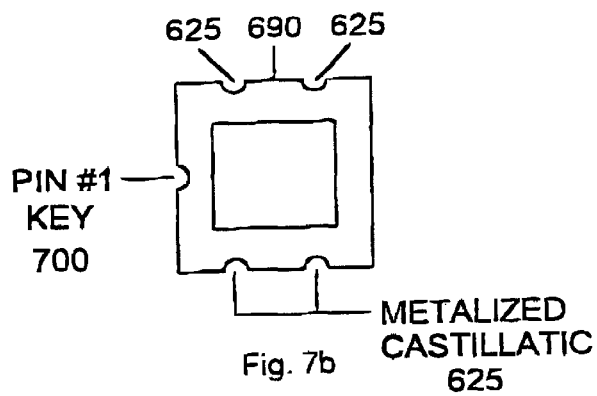
Figure 7C:
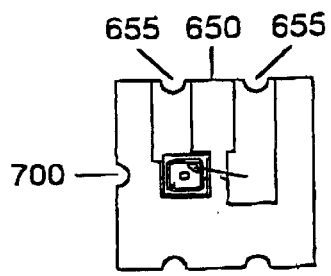
Figure 7D:
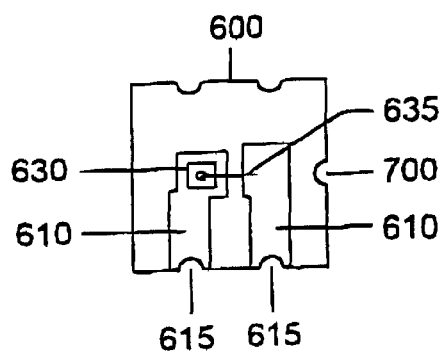

FIG. 6 shows, in a perspective view, three substrates making up a miniaturized optocoupler. The substrates are preferably made of an opaque ceramic insulating material such as black, 90% alumina. The top, photo emitter substrate 600 has two conductors 610 on its lower surface connecting to metallized castellations 615 on the edge. A photo emitter 630 is shown mounted on one conductor, and connected by a wire bond to the second conductor. The second substrate is a ring frame 690, which is open in the center, and has metallized castellations 625 on its edges. The bottom, photo detector substrate 650 has two conductors 660 and 670 on its upper surface and four conductors 695 on its bottom surface. The conductors 660, 670 and 685 are connected to metallized castellations 695 on the edges. A photo detector is shown mounted on one conductor on the top surface and connected to the second conductor by a wire bond. The conductive pattern on the bottom of the photo detector substrate serves as the input and output pads for the finished package.

Figure 8E:
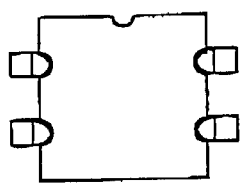
FIGS. 8a–8e shows the bottom and side views of leadless and leaded miniature optocoupler packages.
Figure 8D:
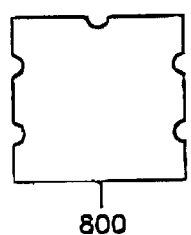
Figure 8C:
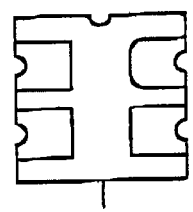
Figure 8B:
Figure 8A:
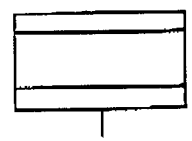

FIG. 7 is a plan view of the same three substrates. The same numbers are used as in FIG. 6 for the identical features. One edge of each substrate has a single notch or castellation 700 used for placing the three substrates in proper orientation for assembly together. After the photo emitter and photo detector have been mounted on the respective substrates, the three substrates are joined together with sealing glass in an enclosed cell to provide the complete optocoupler package as shown in FIG. 8. FIG. 8a shows the top 800, bottom 850 and side 875 views. The castellations are electrically connected by applying a solder coating after the package is sealed together. As shown in FIG. 8, the optocoupler package may be in a leadless configuration, as in FIG. 8a, or provided with gull wing leads as in FIG. 8b, or any other leads known in the art such as J-leads, flatpack and the like.

It will be obvious to those skilled in the art that many types of edge conductors may be used as well as the castellations described in FIGS. 6–8.

Two hundred twenty-five miniaturized single cell, optocoupler packages as shown in FIGS. 6–8 are manufactured on three 2 inch by 2 inch (50 mm×50 mm) black, 92% alumina ceramic sheets. The miniaturized optocouplers are in four-leaded packages, with dimensions 0.120 inch by 0.120 inch (3.05 mm×3.05 mm). Two of the four leads are connected to a light emitting diode (LED) and the castellations on one side of the cell, and the other two leads are connected to a photo transistor and the castellations on the other side of the cell. The castellations on each side of the package are spaced apart on 0.050 inch (1.27mm) centers.

The cells are laid out in a 15 by 15 matrix yielding two hundred twenty-five single cell packages from the three 2"×2" alumina sheets. The 0.120 inch cells are laid out on a 0.126 inch (3.2 mm) grid to allow 0.006 inch (0.15 mm) wide, saw cuts to separate the individual packages.

All three alumina sheets are drilled with holes that will form the castellations when individual cells are cut apart. The holes are oval, 0.020 inch by 0.026 inch (0.51 mm×0.66 mm), drilled on the 0.126 inch grid. After assembly, when the holes will be bisected by a 0.006 inch saw cut, the castellations will be semicircular with a radius or depth of 0.010 inch (0.25 mm). The shape of the castellations is not limited to semicircular, if a thicker ring frame is required, the depth of the castellations may be reduced to 0.006–0.008 inch (0.15–0.20 mm) by truncating the ends of the oval holes.

Two hundred twenty-five square openings, 0.070 inch by 0.070 inch (1.789 mm×1.78 mm), are cut in the second or middle alumina sheet which leaves a gridwork of 0.056 inch alumina strips on 0.126 centers. The oval 0.020 inch by 0.026 inch oval holes are centered in the 0.056 inch strips.

The conductive patterns for the top layer are printed on one of the alumina sheets and on the walls of the oval holes with a thick film molybdenum-/manganese paste. On the second alumina sheet which will serve as the middle or ring frame layer of the package, the oval hole walls also are printed with a thick film molybdenum/manganese paste. The conductive patterns for both sides of the bottom layer and the walls of the oval holes are printed with a thick film, molybdenum/manganese paste on the third alumina sheet. All three alumina sheets are fired to burn off the organic vehicle and bond the molybdenum conductors to the alumina.

A gold, thick film paste is printed and fired on both the first and third, alumina sheets over those areas of the molybdenum conductors that are to be used as wire bond pads and mounting pads for the semiconductor devices. The remaining portions of the molybdenum conductors on the first and third layers as well as the walls of the oval holes on all three layers are electrolessly plated with nickel/boron.

A thick film, sealing glass paste is printed on both sides of the middle or frame layer over the 0.056 inch wide grid, and the paste is dried. The thick film, sealing glass paste is printed and dried in a corresponding 0.056 inch wide grid pattern on the bottom surface of the first or top alumina sheet and on the top surface of the third or bottom alumina sheet.

The LEDs and the photo transistors are mounted on the first and third, alumina sheets with a silver/glass paste (low melting glass with a high silver concentration) which is then fired. The firing also glazes the sealing glass on the 0.056 inch wide grid patterns for subsequent joining. The LEDs and photo transistors are connected to the wire bond pads by gold wires.

The three layers are assembled together and fired at 425° C., reflowing the sealing glass on the layers together.

The two hundred twenty-five assembled cells are cut apart into fifteen strips with a diamond saw. The 0.006 inch wide saw cut bisects the oval holes. The castellations, which are formed by bisecting the oval holes, are dipped in molten solder, which solders together the castellations from top to bottom. Then each of the fifteen strips is cut into fifteen individual cells, forming two hundred twenty-five hermetically sealed, miniaturized, optocoupler packages.

Sixteen-leaded optocouplers packages, containing four LEDs and four photo transistors are made by the same procedure. After the first cut through the holes to form long strips of individual cells with the castellations down the sides, a second cut separated the strips into optocoupler packages containing four cells.

The procedure was used for the production of five-leaded, miniaturized optocoupler packages containing an LED and a photo integrated circuit. Each hermetically sealed, optocoupler package contained an LED and a photo integrated circuit. The miniaturized packages had six castellations, three on each side, but one castellation was inactive since the LED required only two connections.

In a cofired procedure the holes are punched in a green ceramic sheet, and a refractory metal conductive pattern is printed on the green sheet and through the holes for the first layer of the cells. A green, ceramic preform with the holes for the castellations and the openings for the windows is used for the frame layer. The hole walls of the preform are coated with refractory metal paste. The frame layer and the first layer are laminated together and fired forming a sheet covered with small open cells. The photo integrated circuits are mounted on conductive patterns of the cells. Another sheet is prepared with metallized hole walls and LEDs mounted on its conductive patterns. The second sheet is bonded to the top of the cofired frame with sealing glass. The bonded sheets are sawed into strips cutting through the holes and forming the castellations. Individual optocoupler packages containing one or more cells are saw cut out of the strips. The metallized castellations of the first layer and the frame are joined in the cofiring procedure. There is only one sealing glass joint in each castellation to be electrically connected by a soldering process or other process.

The manufacture of optocouplers has been described using thick film hybrid circuit technology and cofired ceramic technology on 2 inch by 2 inch (50 mm×50 mm) ceramic substrates. Methods of manufacturing optocouplers using two layers or lamina for light sources and light sensors and direct, over-under, opposing light sources and light sensors through an intermediate lattice or openwork layer are not limited to thick film hybrid or cofired ceramic circuit technologies. Substrates are not limited in size; larger or smaller ceramic substrates can be used. The same methods of manufacturing can be employed using thin film hybrid circuit technology or combinations of with these and other ceramic circuit technologies.

I claim:

1. An optocoupler package comprising first and second, inorganic, insulating substrates and an inorganic, ring frame joining the first and second substrates forming a cell;

the first substrate being a ceramic circuit having a conductive pattern with at least one photon emitter mounted directly thereon;

the second substrate being a ceramic circuit having a conductive pattern with at least one photon detector mounted in direct, over-under opposition to the photon emitter;

the frame being bonded to the first and second substrates, and the cell being hermetically sealed, capable of containing an inert environment, and forming a completely self-contained, optocoupler package.

2. An optocoupler package according to claim 1 wherein the ring frame comprises at least two laminae.

3. An optocoupler package according to claim 1 wherein the ring frame comprises a conductive pattern.

4. An optocoupler package according to claim 1 wherein at least one of the insulating substrates comprises a hybrid circuit containing other discrete components.

5. An optocoupler package according to claim 1 wherein at least one of the conductive patterns comprises a thick film conductor.

6. An optocoupler package according to claim 5, wherein the thick film conductive pattern comprises at least one, thick film resistor.

7. An optocoupler package according to claim 1 wherein at least one of the insulating substrates comprises a cofired, conductive pattern.

8. An optocoupler package according to claim 7 comprising a cofired ring frame.

9. An optocoupler package according to claim 1 wherein at least one of the conductive patterns comprises a thin film conductor.

10. An optocoupler package according to claim 1 further comprising an inorganic, insulating layer bonded between the photon emitter and photon detector, the layer being transparent to the photons emitted by the emitter.

11. A package having a plurality of optocouplers, the package comprising first and second inorganic, insulating substrates and a common frame sealed to the first and second inorganic substrates forming a plurality of hermetically sealed cells; the first and second insulating substrates having a plurality of photon emitters and photon detectors mounted thereon so that each cell enclosing an optocoupler has at least one photon emitter opposing at least one photon detector; the package being hermetically sealed and capable of containing an inert atmosphere.

12. An optocoupler package according to claim 11 wherein the frame comprises at least two laminae.

13. An optocoupler package according to claim 11 wherein the frame comprises a conductive pattern.

14. An optocoupler package according to claim 11 wherein at least one of the insulating substrates comprises a hybrid circuit containing other discrete components.

15. An optocoupler package according to claim 11 wherein at least one of the conductive patterns comprises a thick film conductor.

16. An optocoupler package according to claim 15, wherein the thick film conductive patterns comprise at least one, thick film resistor.

17. An optocoupler package according to claim 11 wherein at least one of the insulating substrates comprises cofired, conductive patterns.

18. An optocoupler package according to claim 17 comprising a cofired, ring frame.

19. An optocoupler package according to claim 11 wherein at least one of the conductive patterns comprises a thin film conductor.

20. An optocoupler package according to claim 11, further comprising at least one insulating layer bonded to the frame between the photon emitters and the photon detectors, the layer being transparent to the photons emitted by the emitters.

21. A method of manufacturing an optocoupler package comprising:
providing first and second, inorganic insulating substrates;
forming conductive patterns on the substrates;
mounting at least one photon emitter on the conductive pattern of the first insulating substrate;
mounting at least one photon detector on the conductive pattern of the second insulating substrate;
providing an inorganic, ring frame capable of surrounding the photon emitter and photon detector, and
bonding the frame to the first and second substrates, forming a hermetic seal, enclosing the photon emitter and photon detector spaced apart from and opposite each other, the first and second substrates and the frame forming the exterior surfaces of the package.

22. A method according to claim 21 wherein the conductive pattern on at least one of the substrates is formed on both sides of the substrate to include contact pads on the second side of the substrate.

23. The method of claim 21 further comprising mounting other discrete components on at least one of the insulating substrates.

24. A method according to claim 21 further comprising installing a transparent, insulating layer between the photon emitter and the photon detector, the layer being transparent to the photons emitted by the emitter.

25. The method of claim 21 wherein the conductive patterns comprise a thick film conductor.

26. The method of claim 21 wherein at least one of the insulating substrates comprises a cofired, conductive pattern.

27. A method according to claim 26 wherein the frame comprises two green ceramic preforms; cofiring one of the preforms with the green, ceramic sheet for the first insulating substrate and the other preform with the green, ceramic sheet for the second insulating substrate.

28. A method according to claim 26 wherein the frame comprises a green, ceramic preform, and cofiring the preform with a green, ceramic sheetforming one of the insulating substrates.

29. The method of claim 21 wherein the conductive patterns comprise a thin film conductor.

30. A method of manufacturing a hermetically sealed package containing a plurality of optocouplers comprising:
printing a conductive pattern on a first, ceramic, insulating substrate;
printing a conductive pattern on a second, ceramic, insulating substrate;
mounting a plurality of photon emitters and photon detectors directly on the conductive patterns of the first and second substrates;
bonding a ceramic frame between the first and second substrates forming a hermetic seal, the frame having a plurality of cells, each cell enclosing at least one photon emitter opposite at least one photon detector.

31. A method according to claim 30 wherein the conductive pattern on at least one of the substrates is formed on both sides of the substrate to include contact pads on the second side of the substrate.

32. A method of claim 30 further comprising bonding a transparent, insulating layer between a photon emitter and a photon detector, the layer being transparent to the photons emitted by the emitter.

33. The method of claim 30 further comprising mounting other discrete components on at least one of the insulating substrates.

34. The method of claim 30 wherein the conductive patterns comprise at least one thick film conductor.

35. The method of claim 30 wherein the insulating substrates comprise a cofired conductive pattern.

36. A method according to claim 35 wherein the frame comprises two green, ceramic preforms, and cofiring one of the preforms with the green, ceramic sheet for the first insulating substrate and the other preform with the green, ceramic sheet for the second insulating substrate.

37. A method according to claim 35 wherein the frame comprises a green, ceramic preform, and cofiring the preform with a green, ceramic sheet forming one of the insulating substrates.

38. The method of claim 30 wherein the conductive patterns comprise at least one thin film conductor.

39. A method of manufacturing a hermetically sealed optocoupler package comprising:
forming a conductive pattern on a first, planar, insulating, ceramic, substrate, the conductive pattern including conductors on the edge of the substrate;
mounting at least one photon emitter directly on the conductive pattern of the first substrate;
forming a conductive pattern on a second, planar, insulating, ceramic, substrate, the conductive pattern including conductors on the edge of the substrate;
mounting at least one photon detector directly on the conductive pattern of the second substrate;
providing a ceramic, ring frame having conductors on its outer edges;
positioning the frame between the first and second substrates with the edge conductors of the frame, and first and second substrates aligned creating a cell containing a photon emitter opposite a photon detector;
bonding the first and second substrates to the frame forming a hermetic seal, and
electrically connecting the edge conductors of the package.

40. A method according to claim 39 wherein the conductive pattern on at least one of the substrates is formed on both sides of the substrate to include contact pads on the second sides of the substrate, the contact pads being joined to the edge connector.

41. A method according to claim 39 wherein the edge conductors are metallized castellations.

42. A method according to claim 39, wherein the aligned castellations are electrically connected by soldering.

43. A method according to claim 41, wherein a plurality of cells are formed from ceramic sheets;
the sheets being provided with holes corresponding to the castellations of the finished cells;
metallizing the walls of the holes and printing the conductive patterns on the sheets;
mounting a plurality of photon emitters and photon detectors on the conductive patterns;
sealing the ceramic sheets together into a three layer assembly, and
cutting the assembly into individual packages, wherein cuts through the holes form the castellations.

44. Method according to claim 43 wherein the assembly is cut into individual packages containing a plurality of cells.

* * * * *